(12) United States Patent
Kawahara

(10) Patent No.: US 6,551,904 B2
(45) Date of Patent: Apr. 22, 2003

(54) METHOD OF MANUFACTURING PHOTODIODES

(75) Inventor: Hideaki Kawahara, Tokyo (JP)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/853,378

(22) Filed: May 11, 2001

(65) Prior Publication Data

US 2002/0006694 A1 Jan. 17, 2002

(30) Foreign Application Priority Data

May 11, 2000 (JP) ........................................ 2000-138713

(51) Int. Cl.$^7$ .............................................. H01L 21/76
(52) U.S. Cl. ...................................... 438/435; 438/700
(58) Field of Search .............................. 438/42, 43, 44, 438/72, 133, 141, 328, 435, 618, 622, 636, 637, 638, 680, 694, 697, 700, 704, 706, 712, 745

(56) References Cited

U.S. PATENT DOCUMENTS

| 5,166,757 A | * 11/1992 | Kitamura et al. ............. 257/53 |
| 6,054,746 A | * 4/2000 | Bird et al. .................. 257/458 |
| 6,165,899 A | * 12/2000 | Matumoto .................. 438/638 |

FOREIGN PATENT DOCUMENTS

| JP | 61-208850 | 9/1986 |
| JP | 08-288261 | 11/1996 |
| JP | 11-243186 | 9/1999 |

OTHER PUBLICATIONS

Ford, Joseph E.; Aksyuk, Vladimir A.; Bishop, David J.; and Walker, James A. "Wavelength Add–Drop Switching Using Tilting Micromirrors", 1999 IEEE, Journal of Lightwave Technology, vol. 17, No. 5, May 1999.

* cited by examiner

Primary Examiner—David Nelms
Assistant Examiner—David Nhu
(74) Attorney, Agent, or Firm—William D. Kempler; W. James Brady; Frederick J. Telecky, Jr.

(57) ABSTRACT

The object of this invention is to provide a method of manufacturing diodes, said method being a method of manufacturing semiconductor devices whereby an insulating film as the upper layer of the diode can be removed without causing film peeling or leakage. A photodiode is formed by forming a semiconductor layer of a second conduction type 12 upon the surface layer of a semiconductor layer of a first conduction type 11, and next forming a removable mask layer 30 which has etching selectivity with respect to the semiconductor layer of a second conduction type, or alternately, forming an anti-reflection film AR upon the top layer of the semiconductor layer of a second conduction type and then forming a removable mask layer which has etching selectivity with respect to the anti-reflection film. Next, a removable insulating layer I which has etching selectivity with respect to the mask layer is formed upon the top layer of the mask layer. Next, a hole H with its bottom surface consisting solely of the top surface of the mask layer is formed in the insulating layer by using the mask layer as the etching stopper, and next, the mask layer is removed in areas exposed within the interior of the hole selectively with respect to the semiconductor layer of a second conduction type or anti-reflection film and the insulating film.

15 Claims, 14 Drawing Sheets

METHOD OF MANUFACTURING PHOTODIODES

FIELD OF THE INVENTION

The present invention relates to a method of manufacturing semiconductor devices, and particularly to a method of manufacturing PIN photodiodes or other photodiodes.

BACKGROUND OF THE INVENTION

Among semiconductor devices, photodiodes are diodes that generate a current upon receiving light, being used widely as light receiving devices for optical pickup devices built into CD, DVD or other optical disk drives.

Photodiodes have a structure consisting of a semiconductor with a pn junction, and by applying a reverse bias to the pn junction, the depletion layer is widened to induce a high electric field. Light absorbed mainly by the depletion layer generates electron-hole pairs, and drawn by the electric field, the electrons move toward the n-type semiconductor region and the holes move toward the p-type semiconductor region, being detected as current.

The types of said photodiodes include PIN photodiodes wherein an I layer (a p⁻ layer or n⁻ layer) containing a low density of conductive impurities is provided between the p layer and n layer, thus making the depletion layer more easily widened at low voltage, and avalanche photodiodes wherein a region for generating an avalanche breakdowvn is provided.

FIG. 13(a) is a cross-sectional diagram of said PIN photodiode.

For example, an n⁻ semiconductor layer 11 is formed upon a silicon semiconductor substrate 10, and in the region to become the PIN diode (for example, a 100 μm×100 μm region), a p⁻ semiconductor layer 12 is formed upon the surface layer region of the n³¹ semiconductor layer 11, thereby forming a pn junction.

Upon the top layer of the p⁺ semiconductor layer 12 is laminated an insulating film I consisting of a first insulating film 20, second insulating film 21, third insulating film 22, fourth insulating film 23 and fifth insulating film 24. The first through fifth insulating films (20–24) may each consist of silicon oxide films formed by means of the chemical vapor deposition (CVD) method using tetraethylorthosilicate (TEOS) as the raw material, BPSG (borophosphosilicate glass; silicon oxide containing phosphorus and boron) films, silicon nitride films or the like.

The aforementioned insulating film I attenuates the light incident on the p⁺ semiconductor layer 12, so a hole that exposes the p⁺ semiconductor layer 12 is formed in the insulating film I.

When a reverse bias is applied to the aforementioned PIN photodiode, as shown in FIG. 13(b), the depletion layer V is enlarged from the pn junction surface toward the n⁻ semiconductor layer 11 and p⁻ semiconductor layer 12 sides.

Here, the depletion layer is enlarged so that the total number of carriers on the n side and p side become equal, so the n⁻ semiconductor layer 11 side which has a lower carrier density is enlarged to a greater degree.

When light L is incident upon the aforementioned depletion layer, the light L is absorbed by the depletion layer, generating a electron-hole pair (indicated by the o symbol in FIG. 13(b)) which is detected as current. When light L is absorbed by portions not in the depletion layer, an electron-hole pair is not generated (indicated by the × symbol in FIG. 13(b)).

Here follows a description of the method of manufacturing the aforementioned PIN photodiode.

First, as shown in FIG. 14(a), a silicon semiconductor substrate 10 is subjected to ion implantation with phosphorus or other n-type impurities to form an n⁻ semiconductor layer 11.

Next, in the PIN diode formation region (for example, a 100 μm×100 μm region), ion implantation with boron or other p-type impurities is performed using a resist mask (not shown) to form a p⁺ semiconductor layer 12 upon the surface layer region of the n⁻ semiconductor layer 11. Note that the n⁻ semiconductor layer 11 may also be formed by epitaxial growth.

Next, as shown in FIG. 14(b), upon the entire surface of the top layer of the p⁺ semiconductor layer 12 is laminated an insulating film I consisting of a first insulating film 20, second insulating film 21, third insulating film 22, fourth insulating film 23 and fifth insulating film 24.

Here, the first through fifth insulating films (20–24) may be formed by depositing silicon oxide films formed by means of the CVD method using TEOS as the raw material, depositing BPSG films, or they may be laminated by a step of depositing silicon nitride films by the CVD method or the like.

Aluminum or other wiring is normally formed in regions not shown in the figure between the aforementioned first through fifth insulating films (20–24), and in this case, the first through fifth insulating films (20–24) are formed such that they reduce the differences in level arising due to the aforementioned wiring and the like.

In the state shown in FIG. 14(b), the insulating film I is formed upon the top layer of the depletion layer region which extends from the interface between the p⁺ semiconductor layer 12 and n⁻ semiconductor layer 11 which is the light-sensitive region, and this insulating film I attenuates the light incident on the p⁺ semiconductor layer 12, so a hole that exposes the p⁺ semiconductor layer 12 is normally formed in the insulating film 1.

The aforementioned hole is formed by RIE (reactive ion etching) or another type of dry etching or wet etching after the formation of a resist film with the aforementioned hole pattern.

However, in the aforementioned conventional process of manufacturing PIN photodiodes, at the time of forming the hole that exposes the p⁺ semiconductor layer in the insulating film, peeling of the laminated insulating films may occur, or leakage may occur at the pn junction of the diode, and other problems may also occur.

FIG. 15 is a cross-sectional diagram showing the state at the time of formation of the hole H in the aforementioned insulating film I that exposes the p⁺ semiconductor layer 12, after the resist film R with the hole pattern is formed, and after the dry etching is performed.

In the aforementioned method, since overetching still occurs after the first insulating film corresponding to the bottom of the hole is removed by etching, the surface of the p⁺ semiconductor layer 12 is hit directly by etching gas and suffers damage D, becoming the cause of occurrence of leakage.

FIG. 16 is a cross-sectional diagram showing the state at the time of formation of the hole H in the aforementioned insulating film I that exposes the p⁺ semiconductor layer 12, after the resist film R with the hole pattern is formed, and after the wet etching is performed.

In the aforementioned method, in contrast to dry etching, the surface of the p⁺ semiconductor layer 12 is not hit directly by etching gas and does not suffer damage, but the etching rates of the first through fifth insulating films (20–24) which make up the insulating film I are different depending on the composition or film quality or the like, so films with high etching rates X are gouged out from the inside wall surface of the hole, and peeling of the film due thereto may occur.

The present invention came about in light of the aforementioned problem and thus the object of the present invention is to provide a method of manufacturing PIN diodes or other diodes, said method being a method of manufacturing semiconductor devices whereby an insulating film as the upper layer of the diode can be removed without causing film peeling or leakage.

SUMMARY OF THE INVENTION

In order to achieve the aforementioned object, the method of manufacturing photodiodes according to the present invention comprises: a step of forming a second semiconductor layer of a second conduction type upon the primary surface of a first semiconductor layer of a first conduction type, a step of forming a mask layer upon said second semiconductor layer, a first etching step of etching said first insulating layer by using said mask layer as a stopper, thus forming a hole above said mask layer, and a second etching step of removing said mask layer by etching via said hole.

The method of manufacturing photodiodes according to the present invention preferably further comprises a step of forming a second insulating layer upon said second semiconductor layer, thus forming said mask layer upon said second insulating layer.

In addition, the method of manufacturing photodiodes according to the present invention is preferably such that said first insulating layer comprises a silicon oxide film or silicon nitride film, and said mask layer is a metal film.

The method of manufacturing photodiodes according to the present invention is preferably such that said first etching is dry etching and said second etching is wet etching.

The method of manufacturing photodiodes according to the present invention is preferably such that said second semiconductor layer is formed in a banded pattern comprising mutually separated first semiconductor regions and second semiconductor regions, or such that said second semiconductor layer is formed in a checkerboard pattern.

In the aforementioned method of manufacturing photodiodes according to the present invention, a photodiode is formed by forming, upon the surface layer (primary surface) of a first semiconductor layer of a first conduction type, a second semiconductor layer of a second conduction type that has portions partitioned by means of the first semiconductor layer on a single cross section, for example.

Next, a mask layer which has a different etching selectivity with respect to the semiconductor layer is formed upon the top layer of the semiconductor layer of a second conduction type.

Next, a first insulating layer, comprising silicon oxide films or silicon nitride films or the like for example, which has a different etching selectivity with respect to the mask layer is formed upon the top layer of the mask layer.

Next, a hole with its bottom surface consisting solely of the top surface of the mask layer is formed in the first insulating layer by dry etching or the like using the mask layer as an etching stopper.

Next, wet etching or the like is used to selectively remove the mask layer in exposed areas within the interior of the hole.

By means of the aforementioned method of manufacturing photodiodes according to the present invention, when the insulating film which is the layer atop the diode is removed, the mask layer is used as the etching stopper, so in order to prevent the occurrence of gouging from the wall surface in the interior of the hole which causes film peeling, even when dry etching or other etching techniques are used, the substrate at this stage (the second semiconductor layer) (or the second semiconductor layer formed between the substrate and the mask layer) is protected by a mask layer, so it does not suffer damage which causes leakage.

In addition, when the mask layer exposed in the interior of the hole is removed, in order to prevent damage to the substrate (the second semiconductor layer), even if wet etching or other etching techniques are used, it is possible to selectively remove the mask layer without the occurrence of gouging from the wall surface in the interior of the hole in the first insulating film.

Therefore, in the method of manufacturing diodes, it is possible to remove the insulating film which is the layer atop the diode without the occurrence of film peeling or leakage.

In addition, the second semiconductor layer is formed such that it has portions partitioned by means of the first semiconductor layer on at least a single cross section, so when stipulated voltages are applied to the first semiconductor layer and second semiconductor layer, respectively, the depletion layer extends from each junction surface toward the first semiconductor layer between said second semiconductor layers, and the portions of the semiconductor layer in the portions that partition the second semiconductor layer can be made a depletion layer contributing to photoelectric conversion, thus increasing the sensitivity of the photodiode and improving its characteristics.

REFERENCE NUMERALS AND SYMBOLS AS SHOWN IN THE FIGURES

10 . . . silicon semiconductor substrate, 11 . . . n$^-$ semiconductor layer, 12 . . . p$^+$ semiconductor layer, 12a . . . first p$^+$ semiconductor layer, 12b . . . second p$^+$ semiconductor layer, 20 . . . first insulating film, 21 . . . second insulating film, 22 . . . third insulating film, 23 . . . fourth insulating film, 24 . . . fifth insulating film, 25 . . . silicon oxide film, 26. . . silicon nitride film, 27 . . . LOCOS element separation insulating film. 30, 30a . . . mask layer, 31 . . . upper-layer wiring, 32, 33 . . . wiring, AR . . . anti-reflection film, C . . . contact, D . . . damage, $F_{v1}$, $F_{v2}$ . . . end face of depletion layer, H . . . hole, I . . . insulating film, $J_1$, $J_2$ . . . junction surface, L . . . light, R . . . resist film, V, $V_1$, $V_2$ . . . depletion layer, X . . . gouge.

DESCRIPTION OF EMBODIMENTS

Embodiment 1

Figure 1A:
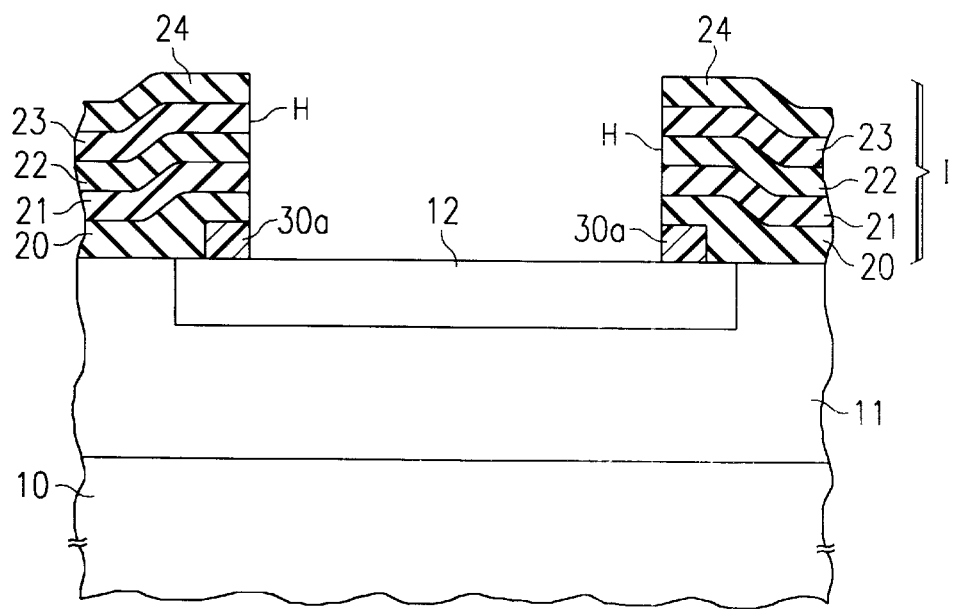
FIG. 1(a) is a cross-sectional diagram of a semiconductor device having a PIN photodiode according to Embodiment 1.

FIG. 1(a) is a cross-sectional diagram of a semiconductor device having a PIN photodiode according to this embodiment.

For example, an n$^-$ semiconductor layer 11 is formed upon a silicon semiconductor substrate 10, and in the region to become the PIN diode (for example, a 100 μm×100 μm region), a p$^+$ semiconductor layer 12 is formed upon the surface layer region (a region to a depth of roughly 0.5–0.8 μm from the surface of the n$^-$ semiconductor layer 11) of the n$^-$ semiconductor layer 11, thereby forming a pn junction.

Upon the top layer of the p$^+$ semiconductor layer 12 is laminated an insulating film I consisting of a first insulating film 20, second insulating film 21, third insulating film 22, fourth insulating film 23 and fifth insulating film 24. The first through fifth insulating films (20–24) may each consist of silicon oxide films formed by means of the chemical vapor deposition (CVD) method using tetraethylorthosilicate (TEOS) as the raw material, BPSG (borophosphosilicate glass; silicon oxide containing phosphorus and boron) films, silicon nitride films or the like.

The aforementioned insulating film I attenuates the light incident on the p+semiconductor layer 12, so a hole H that exposes the p$^+$ semiconductor layer 12 is formed in the insulating film I.

In addition, a portion of the mask layer 30a consisting of TiW or other metal or the like is left in the periphery of the hole H on the top layer of the aforementioned p$^+$ semiconductor layer 12 and bottom layer of the insulating film I. This mask layer 30a functions in the manufacturing process, and in this structure, it is simply present as a conducting layer connected to the p$^+$ semiconductor layer 12.

Figure 1B:
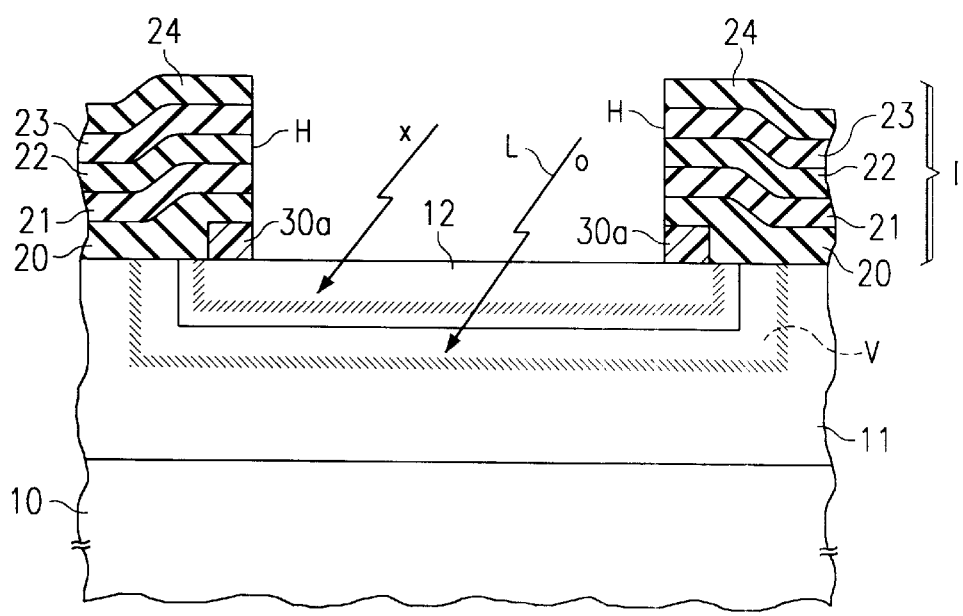
FIG. 1(b) is a diagram showing the widening of the depletion layer when a reverse bias is applied to the PIN photodiode shown in FIG. 1(a).

When a reverse bias is applied to the aforementioned PIN photodiode, as shown in FIG. 1(b), the depletion layer V is enlarged from the pn junction surface toward the n$^-$ semiconductor layer 11 and p$^+$ semiconductor layer 12 sides.

Here, the depletion layer is enlarged so that the total number of carriers on the n side and p side become equal, so the n$^-$ semiconductor layer 11 side which has a lower carrier density is enlarged to a greater degree.

When light L is incident upon the aforementioned depletion layer, the light L is absorbed by the depletion layer, generating a electron-hole pair (indicated by the ○ symbol in FIG. 1(b)) which is detected as current. When light L is absorbed by portions not in the depletion layer, an electron-hole pair is not generated (indicated by the×symbol in FIG. 1(b)).

Here follows a description of the method of manufacturing the aforementioned PIN photodiode.

Figure 2A:
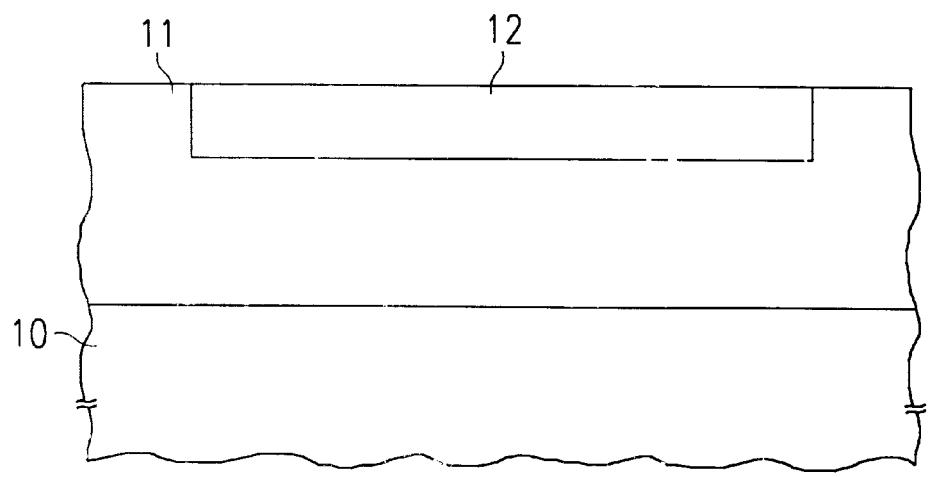
FIG. 2 is a cross-sectional diagram illustrating the manufacturing process in the method of manufacturing the semiconductor devices shown in FIG. 1, where (a) shows the process up until the formation of the p$^+$ semiconductor layer and (b) shows the process up until the formation of the mask layer.

First, as shown in FIG. 2(a), a silicon semiconductor substrate 10 is subjected to ion implantation with phosphorus or other n-type impurities to a concentration of roughly $10^{13}$–$10^{15}$/cm$^3$, for example, to form an n$^-$ semiconductor layer 11.

Next, in the PIN diode formation region (for example, a 100 μm×100 μm region), ion implantation with boron or other p-type impurities is performed to a concentration of roughly $10^{18}$–$10^{20}$/cm$^3$ using a resist mask (not shown) to form a p$^+$ semiconductor layer 12 upon the surface layer region (a region to a depth of roughly 0.5–0.8 μm from the surface of the n$^-$ semiconductor layer 11) of the n$^-$ semiconductor layer 11.

Figure 2B:
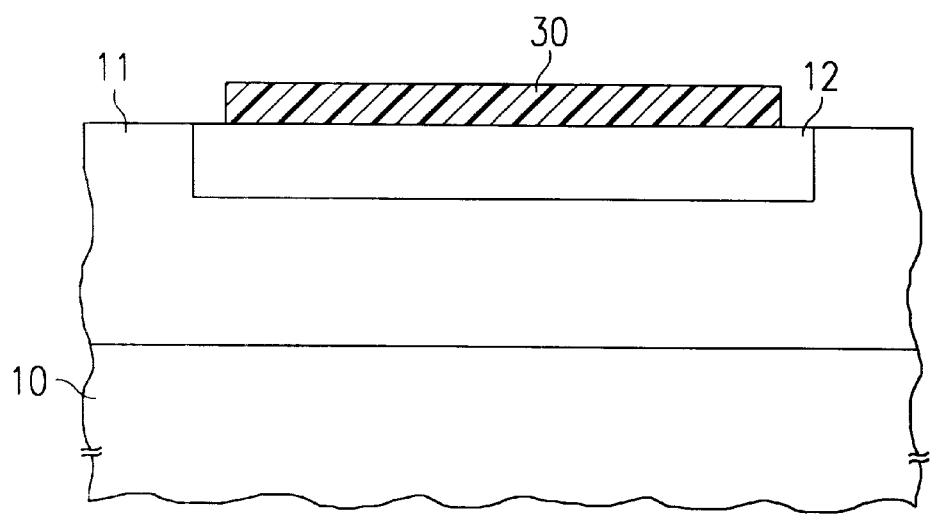

Next, as shown in FIG. 2(b), a layer of TiW or other metal is deposited to a film thickness of 200–300 nm by the sputtering method, for example, and patterning is performed to form a mask layer 30 on the top layer of the p$^+$ semiconductor layer 12.

Here, the material constituting the mask layer 30 may be any removable material that has selectivity with respect to the lower-layer p$^+$ semiconductor layer 12 (silicon substrate) and the insulating film (silicon oxide, silicon nitride, etc.) to be formed in a subsequent step, and is not limited to the aforementioned metal layer.

Figure 3A:
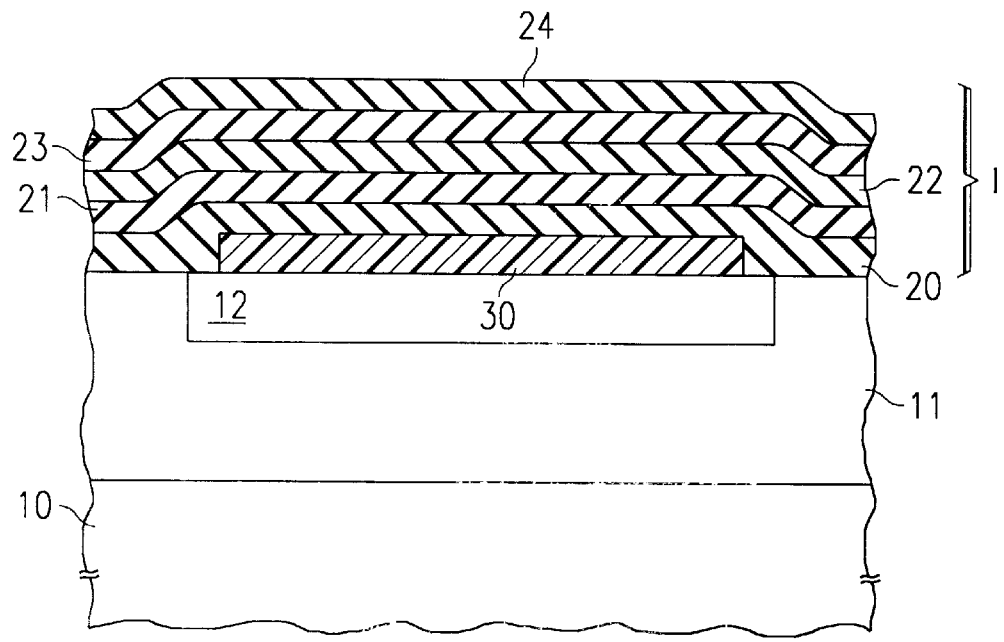
FIG. 3 is a cross-sectional diagram illustrating a continuation of the process shown in FIG. 2, where (a) shows the process up until the formation of the insulating film and (b) shows the process up until the formation of the hole.

Next, as shown in FIG. 3(a), upon the entire surface of the top layer of the mask layer 30 are laminated a first insulating film 20, second insulating film 21, third insulating film 22, fourth insulating film 23 and fifth insulating film 24, thus forming a laminated insulating film I.

Here, the first through fifth insulating films (20–24) may be formed by depositing silicon oxide films formed by means of, for example, the CVD method using TEOS as the raw material, depositing BPSG films, or they may be laminated by a step of depositing silicon nitride films by the CVD method or the like.

Here, the material constituting the aforementioned first through fifth insulating films (20–24) may be any removable material that has selectivity with respect to the lower-layer mask layer 30, and is not limited to the aforementioned silicon oxide film or silicon nitride film.

Aluminum or other wiring is normally formed in regions not shown in the figure between the aforementioned first through fifth insulating films (20–24), and in this case, the first through fifth insulating films (20–24) are formed such that they reduce the differences in level arising due to the aforementioned wiring and the like.

Figure 3B:
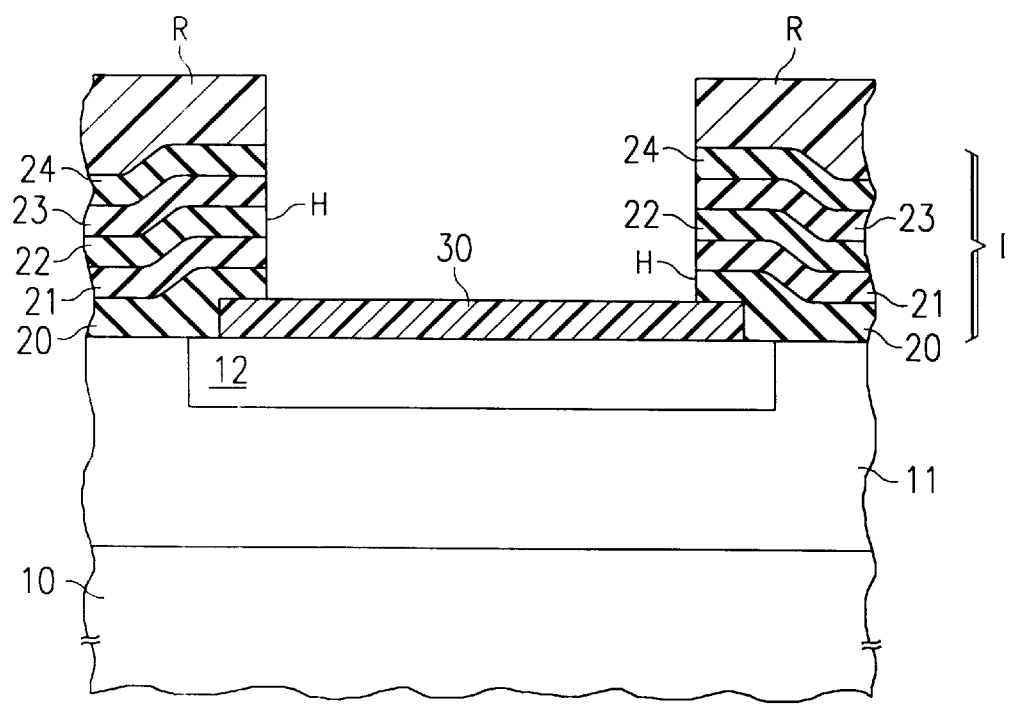

Next, as shown in FIG. 3(b), a resist film R is formed with a pattern for creating a hole for the depletion layer region which extends from the interface between the p$^+$ semiconductor layer 12 and n$^-$ semiconductor layer 11 which is the light-sensitive region, and then etching is performed by means of RIE (reactive ion etching) or another type of dry etching to remove the insulating film I on the top layer of the aforementioned light-sensitive region using the mask layer 30 as the etching stopper.

The insulating film I attenuates the light incident on the p$^+$ semiconductor layer 12, so by removing the insulating film in the light-sensitive region as described above, it is possible to increase the sensitivity of the photodiode.

Next, wet etching or the like is used to remove the portions of the mask layer 30 exposed within the hole H selectively with respect to the p$^+$ semiconductor layer 12 (silicon substrate) and insulating film I, thus exposing the p$^+$ semiconductor layer 12. In this manner, the semiconductor device having a PIN photodiode according to this embodiment shown in FIG. 1(a) can be manufactured.

By means of the aforementioned method of manufacturing photodiodes according to the present embodiment, when the insulating film I which is the layer atop the diode is removed, the mask layer 30 is used as the etching stopper, so in order to prevent the occurrence of gouging from the wall surface in the interior of the hole H which causes film peeling, even when dry etching or other etching techniques are used, the substrate at this stage (the p$^+$ semiconductor layer 12) is protected by the mask layer 30, so it does not suffer damage which causes leakage.

In addition, when the aforementioned mask layer 30 exposed in the interior of the hole H is removed, in order to prevent damage to the substrate (the p$^+$ semiconductor layer 12), even if wet etching or other etching techniques are used, it is possible to selectively remove the mask layer 30 without the occurrence of gouging from the wall surface in the interior of the hole H in the first insulating film I.

Therefore, in the method of manufacturing diodes, it is possible to remove the insulating film which is the layer atop the diode without the occurrence of film peeling or leakage.

Embodiment 2

Figure 4A:
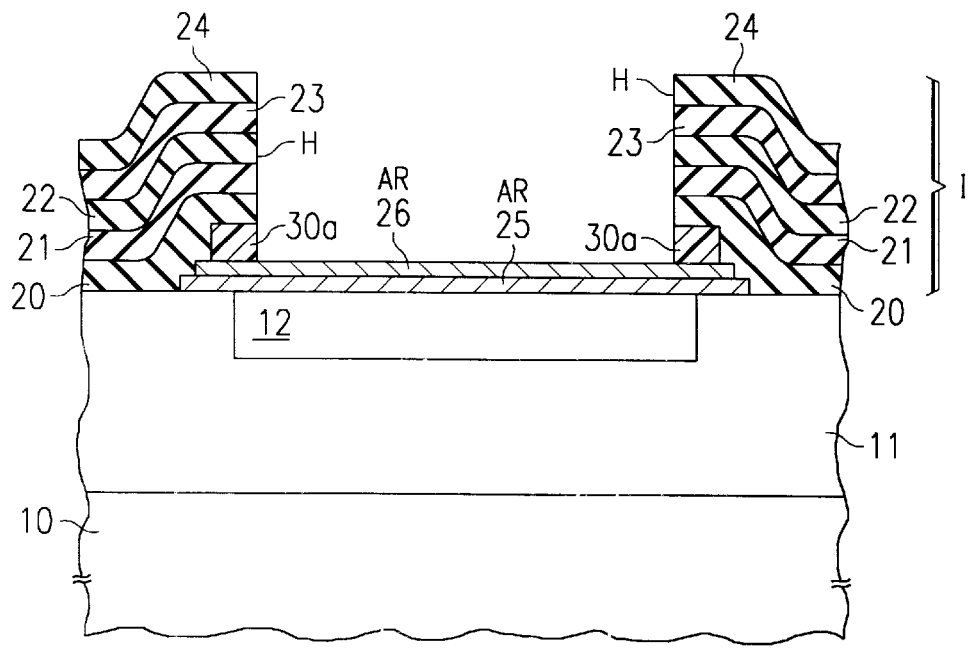
FIG. 4(a) is a cross-sectional diagram of a semiconductor device having a PIN photodiode according to Embodiment 2.

FIG. 4(a) is a cross-sectional diagram of a semiconductor device having a PIN photodiode according to this embodiment.

For example, an n$^-$ layer 11 is formed upon a silicon semiconductor substrate 10, and in the region to become the PIN diode (for example, a 100 μm×100 μm region), a p$^+$ semiconductor layer 12 is formed upon the surface layer region (a region to a depth of roughly 0.5–0.8 μm from the surface of the n$^-$ semiconductor layer 11) of the n– semiconductor layer 11, thereby forming a pn junction.

Upon the top layer of the p$^+$ semiconductor layer 12 is formed an anti-reflection film AR consisting of a silicon oxide film 25 and a silicon nitride film 26.

Upon the anti-reflection film AR is laminated an insulating film I consisting of a first insulating film 20, second insulating film 21, third insulating film 22, fourth insulating film 23 and fifth insulating film 24. The first through fifth insulating films (20–24) may each consist of silicon oxide films formed by means of the CVD method using TEOS as the raw material, BPSG films, silicon nitride films or the like.

The aforementioned insulating film I attenuates the light incident on the p$^+$ semiconductor layer 12, so a hole H that exposes the p$^+$ semiconductor layer 12 is formed in the insulating film I.

In addition, a portion of the mask layer 30a consisting of TiW or other metal or the like is left in the periphery of the hole H on the top layer of the aforementioned anti-reflection film AR and bottom layer of the insulating film I. This mask layer 30a functions in the manufacturing process, and in this structure, it is simply present as a conducting layer remaining upon the anti-reflection film AR.

Figure 4B:
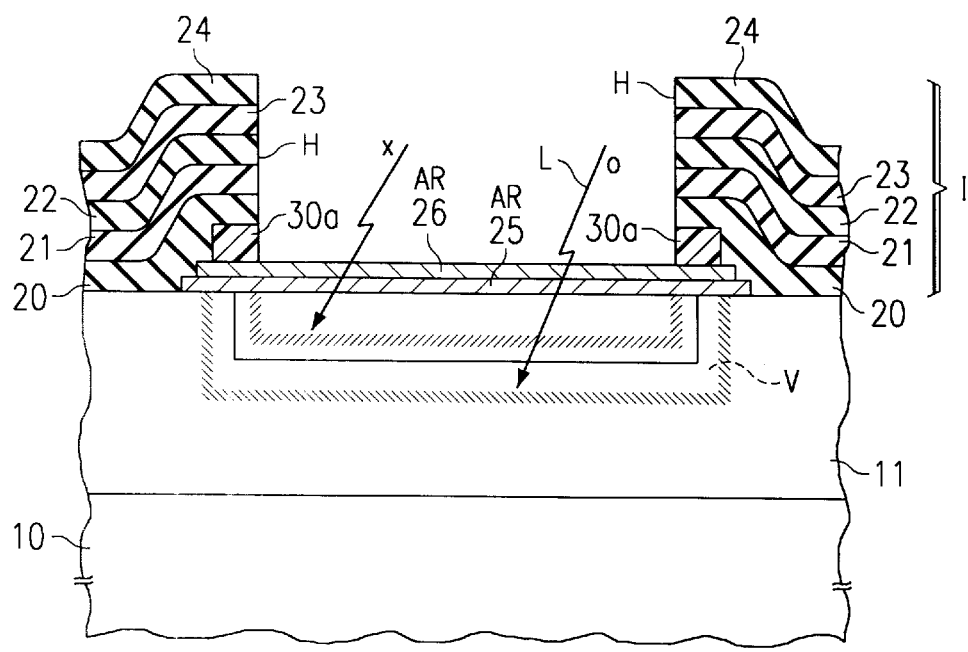
FIG. 4(b) is a diagram showing the widening of the depletion layer when a reverse bias is applied to the PIN photodiode shown in FIG. 4(a).

When a reverse bias is applied to the aforementioned PIN photodiode, as shown in FIG. 4(b), the depletion layer V is enlarged from the pn junction surface toward the n$^-$ layer 11 and p$^+$ semi conductor layer 12 sides.

Here, the depletion layer is enlarged so that the total number of carriers on the n side and p side become equal, so the n$^-$ layer 11 side which has a lower carrier density is enlarged to a greater degree.

When light L is incident upon the aforementioned depletion layer, the light L is absorbed by the depletion layer, generating a electron-hole pair (indicated by the ○ symbol in FIG. 4(b)) which is detected as current. When light L is absorbed by portions not in the depletion layer, an electron-hole pair is not generated (indicated by the × symbol in FIG. 4(b)).

Here follows a description of the method of manufacturing the aforementioned PIN photodiode.

Figure 5A:
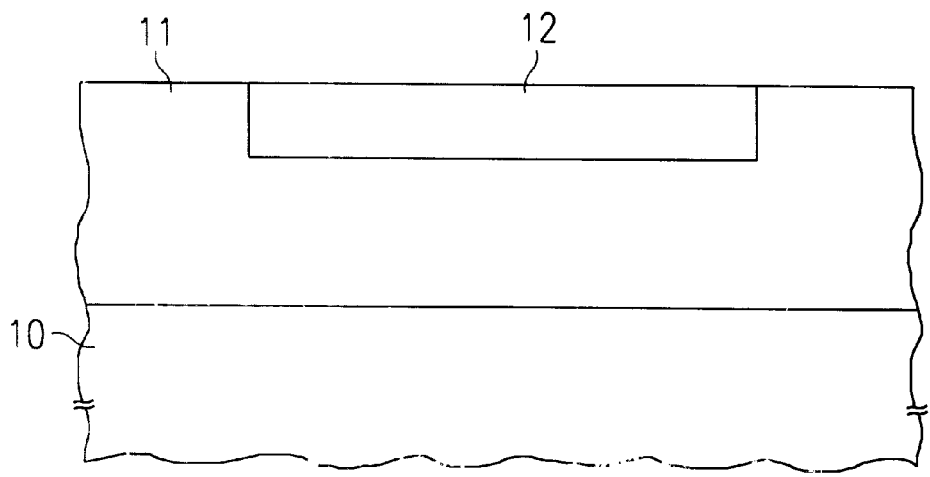
FIG. 5 is a cross-sectional diagram illustrating the manufacturing process in the method of manufacturing the semiconductor devices shown in FIG. 4, where (a) shows the process up until the formation of the p$^+$ semiconductor layer and (b) shows the process up until the formation of the silicon oxide film.
Figure 5B:
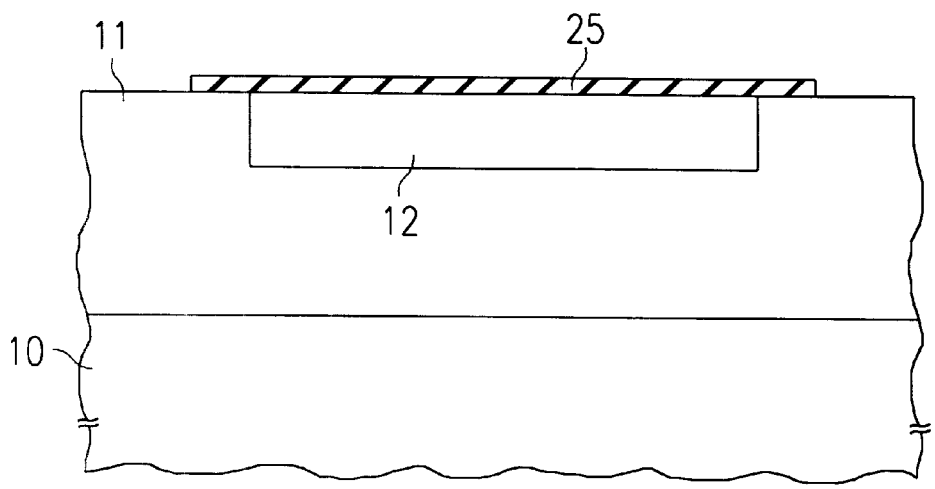

First, as shown in FIG. 5(a), a silicon semiconductor substrate 10 is subjected to ion implantation with phosphorus or other n-type impurities to a concentration of roughly $10^{13}$–$10^{15}$/cm$^3$, for example, to form an n$^-$ semiconductor layer 11.

Next, in the PIN diode formation region (for example, a 100 μm×100 μm region), ion implantation with boron or other p-type impurities is performed to a concentration of roughly $10^{18}$–$10^{20}$/cm$^3$ using a resist mask (not shown) to form a p$^+$ semiconductor layer 12 upon the surface layer region (a region to a depth of roughly 0.5–0.8 μm from the surface of the n$^-$ semiconductor layer 1I) of the n$^-$ semiconductor layer 11.

Next, as shown in FIG. 5(a), a silicon oxide film 25 with a thickness of roughly 30 nm, for example, is formed by means of the low-pressure CVD method using TEOS as the raw material, for example, and patterning is performed if necessary.

Figure 6A:
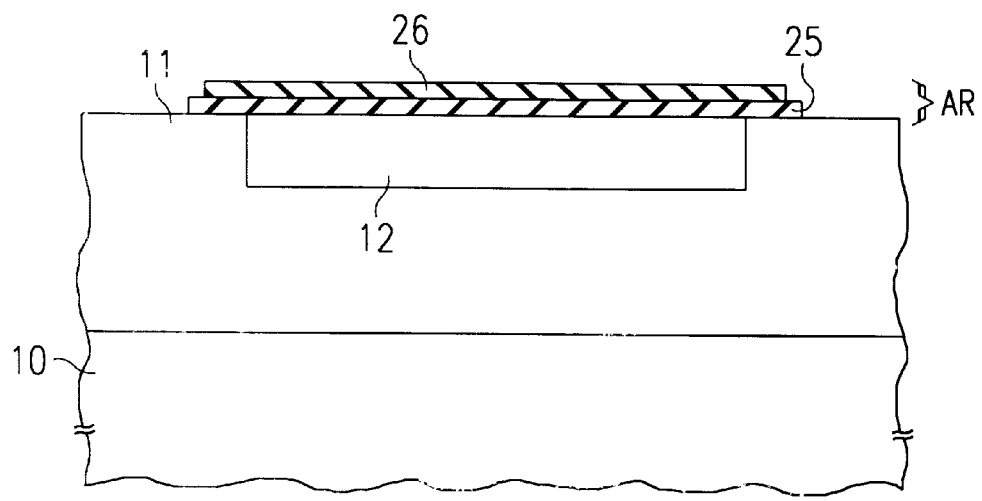
FIG. 6 is a cross-sectional diagram illustrating a continuation of the process shown in FIG. 5, where (a) shows the process up until the formation of the silicon nitride film and (b) shows the process up until the formation of the mask layer.

Next, as shown in FIG. 6(a), a silicon nitride film 26 with a thickness of roughly 37 nm, for example, is formed by means of the low-pressure CVD method, for example, and patterning is performed if necessary.

This completes the formation of the anti-reflection film AR consisting of the silicon oxide film 25 and the silicon nitride film 26.

Figure 6B:
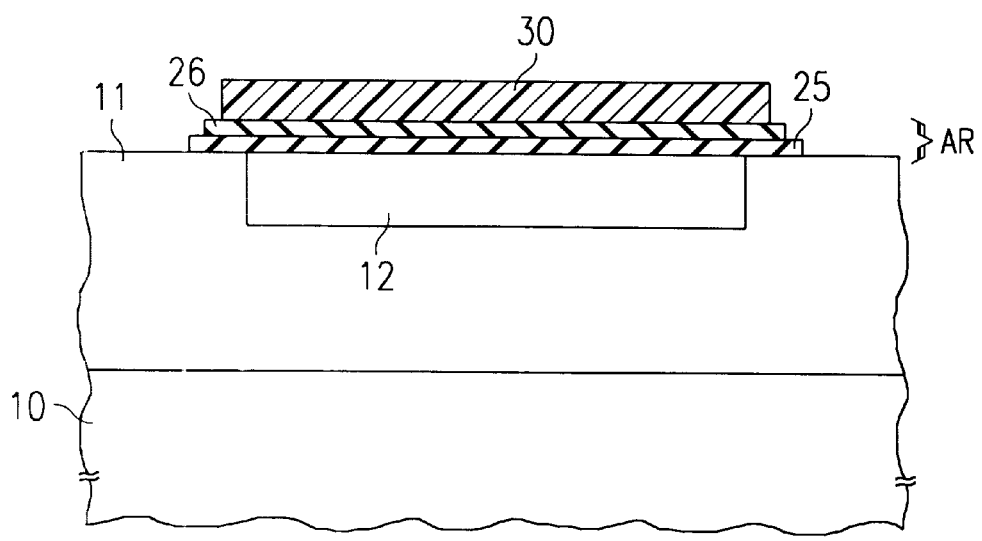

Next, as shown in FIG. 6(b), a layer of TiW or other metal is deposited upon the top layer of the anti-reflection film AR to a film thickness of 200–300 nm nm by the sputtering method, for example, and patterning is performed to form a mask layer 30 on the top layer of the anti-reflection film AR.

Here, the material constituting the mask layer 30 may be any removable material that has selectivity with respect to the lower-layer anti-reflection film AR (having a silicon nitride film on its surface in this embodiment) and the insulating film (silicon oxide, silicon nitride, etc.) to be formed in a subsequent step, and is not limited to the aforementioned metal layer.

Figure 7A:
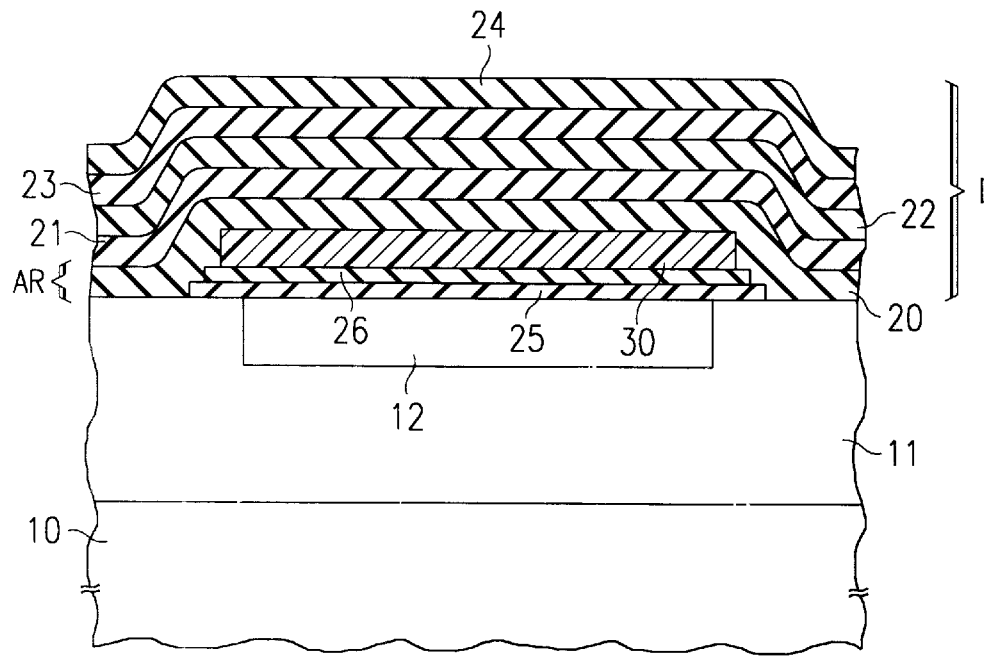
FIG. 7 is a cross-sectional diagram illustrating a continuation of the process shown in FIG. 6, where (a) shows the process up until the formation of the insulating film and (b) shows the process up until the formation of the hole.

Next, as shown in FIG. 7(a), upon the entire surface of the top layer of the mask layer 30 are laminated a first insulating film 20, second insulating film 21, third insulating film 22, fourth insulating film 23 and fifth insulating film 24, thus forming a laminated insulating film I.

Here, the first through fifth insulating films (20–24) may be formed by depositing silicon oxide films formed by means of, for example, the CVD method using TEOS as the raw material, depositing BPSG films, or they may be laminated by a step of depositing silicon nitride films by the CVD method or the like.

Here, the material constituting the aforementioned first through fifth insulating films (20–24) may be any removable material that has selectivity with respect to the lower-layer mask layer 30, and is not limited to the aforementioned silicon oxide film or silicon nitride film.

Aluminum or other wiring is normally formed in regions not shown in the figure between the aforementioned first through fifth insulating films (20–24), and in this case, the first through fifth insulating films (20–24) are formed such that they reduce the differences in level arising due to the aforementioned wiring and the like.

Figure 7B:
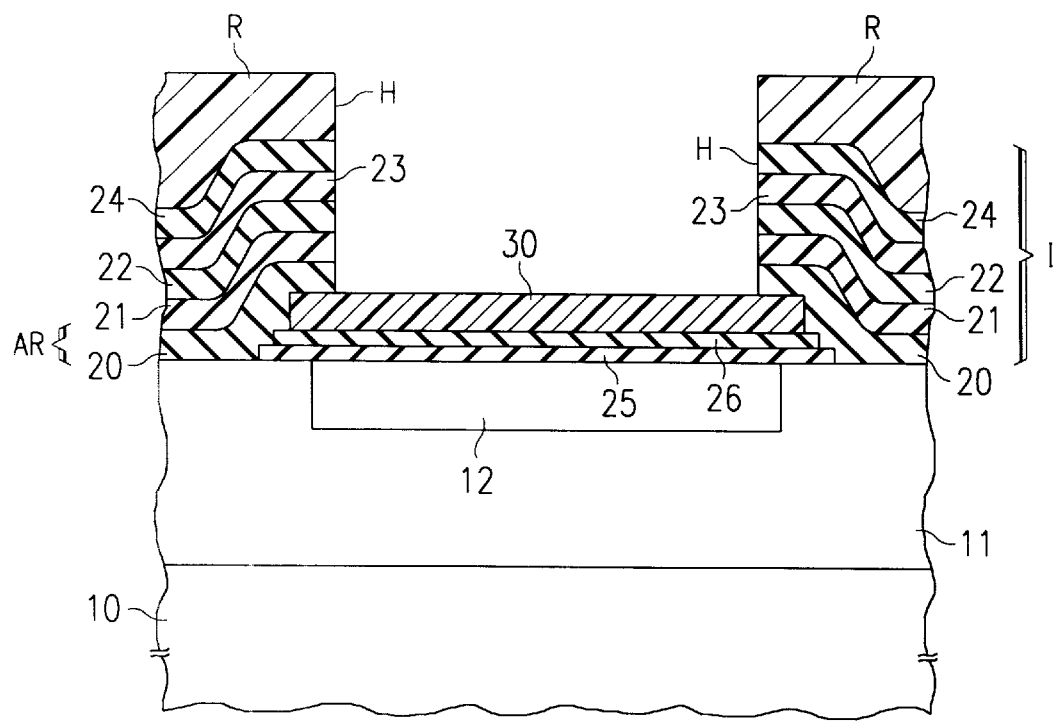

Next, as shown in FIG. 7(b), a resist film R is formed with a pattern for creating a hole for the depletion layer region which extends from the interface between the $p^+$ semiconductor layer 12 and $n^-$ semiconductor layer 11 which is the light-sensitive region, and then etching is performed by means of RIE or another type of dry etching to remove the insulating film I on the top layer of the aforementioned light-sensitive region using the mask layer 30 as the etching stopper.

The insulating film I attenuates the light incident on the $p^+$ semiconductor layer 12, so by removing the insulating film in the light-sensitive region as described above, it is possible to increase the sensitivity of the photodiode.

Next, wet etching or the like is used to remove the portions of the mask layer 30 exposed within the hole H selectively with respect to the anti-reflection film AR (having a silicon nitride film on its surface in this embodiment) and insulating film I, thus exposing the anti-reflection film AR. In this manner, the semiconductor device having a PIN photodiode according to this embodiment shown in FIG. 4(a) can be manufactured.

By means of the aforementioned method of manufacturing photodiodes according to the present embodiment, when the insulating film I which is the layer atop the diode is removed, the mask layer 30 is used as the etching stopper, so in order to prevent the occurrence of gouging from the wall surface in the interior of the hole H which causes film peeling, even when dry etching or other etching techniques are used, the substrate at this stage (the $p^+$ semiconductor layer 12) is protected by the mask layer 30 and anti-reflection film AR, so it does not suffer damage which causes leakage.

In addition, when the aforementioned mask layer 30 exposed in the interior of the hole H is removed, in order to prevent damage to the substrate (the $p^+$ semiconductor layer 12), even if wet etching or other etching techniques are used, it is possible to selectively remove the mask layer 30 without the occurrence of gouging from the wall surface in the interior of the hole H in the first insulating film I.

Therefore, in the method of manufacturing diodes, it is possible to remove the insulating film which is the layer atop the diode without the occurrence of film peeling or leakage.

In addition, by means of the present embodiment, the anti-reflection film, which is difficult to form after the formation of the hole, is formed in advance upon the photodiode prior to the formation of the insulating film, so it has the advantage that the anti-reflection film is formed after the hole.

Embodiment 3

Figure 8A:
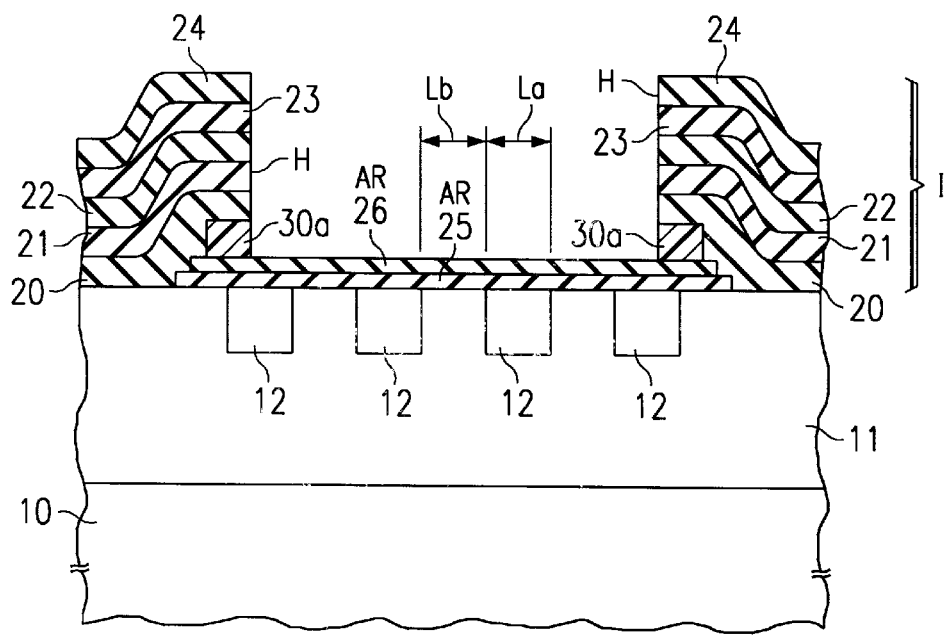
FIG. 8(a) is a cross-sectional diagram of a semiconductor device having a PIN photodiode according to Embodiment 3.

FIG. 8(a) is a cross-sectional diagram of a semiconductor device having a PIN photodiode according to this embodiment.

This PIN photodiode is essentially identical to the semiconductor device according to Embodiment 2 shown in FIG. 4(a), but differs in that it has a layout wherein the $p^+$ semiconductor layer 12 is formed in bands with a width of La that are partitioned from the adjacent band of $p^+$ semiconductor layer 12 by bands of the $n^-$ semiconductor layer 11 with a width of Lb.

The width La of the bands of the aforementioned the $p^+$ semiconductor layer 12 may be roughly 3–4 μm for example, and the width Lb by which the bands of the $p^+$ semiconductor layer 12 are partitioned from the adjacent band of the $p^+$ semiconductor layer 12 may be roughly 10 μm, for example.

Figure 8B:
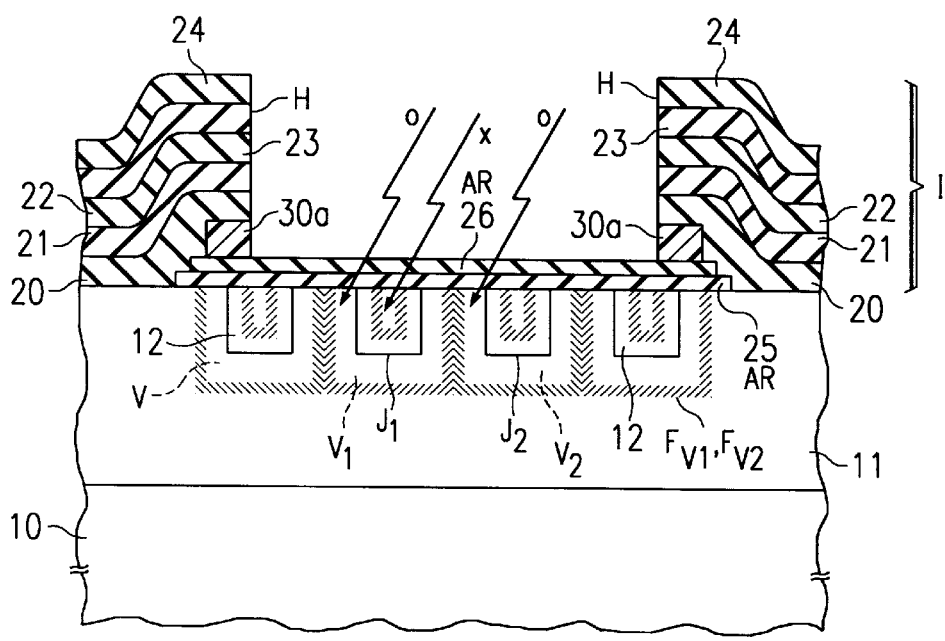
FIG. 8(b) is a diagram showing the widening of the depletion layer when a reverse bias is applied to the PIN photodiode shown in FIG. 8(a).

When a reverse bias of roughly 10 V, for example, is applied to the aforementioned PIN photodiode, as shown in FIG. 8(b), the depletion layer V is enlarged from the pn junction surface toward the $n^-$ semiconductor layer 11 and $p^+$ semiconductor layer 12 sides. Here, the depletion layer is enlarged so that the total number of carriers on the n side and p side become equal, so the $n^-$ semiconductor layer 11 side which has a lower carrier density is enlarged to a greater degree.

In the aforementioned PIN photodiode, the $p^+$ semiconductor layer 12 has a layout wherein the $p^+$ semiconductor layer 12 is partitioned by the $n^-$ semiconductor layer 11, and the depletion layer V extends from the junction surface between the $n^-$ semiconductor layer 11 and the $p^+$ semiconductor layer 12 partitioned by the $n^-$ semiconductor layer 11 toward the side of the nh semiconductor layer 11 between the bands of the $p^+$ semiconductor layer 12, and specifically, the extension can be made to such a degree that end face $F^{V1}$ of depletion layer $V^1$ extending from one junction surface J, among the junction surfaces between the $n^-$ semiconductor layer 11 and the $p^+$ semiconductor layer 12 partitioned by the $n^-$ semiconductor layer 11, and end face $F_{V2}$ of depletion layer $V_2$ extending from another junction surface $J_2$ among the junction surfaces between the $n^-$ semiconductor layer 11 and the $p^+$ semiconductor layer 12 come into contact.

When light L is incident upon the aforementioned depletion layer, the light L is absorbed by the depletion layer, generating a electron-hole pair (indicated by the ○ symbol in FIG. 8(b)) which is detected as current. When light L is absorbed by portions not in the depletion layer, an electron-hole pair is not generated (indicated by the ×symbol in FIG. 8(b)). In the present embodiment, the portion of the n⁻ semiconductor layer 11 that partitions the p⁺ semiconductor layer 12 in particular can be depleted, so light can reach the depletion layer directly without passing through non-depleted regions in order to reach the depletion layer, which is the region in which electron-hole pairs are generated, thus improving the sensitivity of the photodiode and improving its characteristics.

In the aforementioned PIN photodiode, the width La of the bands of the p⁺ semiconductor layer 12, the width Lb between the bands of the p⁺ semiconductor layer 12, the p-type impurity concentration of the p⁺ semiconductor layer 12, the n-type impurity concentration of the n⁻ semiconductor layer 11, and the reverse bias applied can be selected appropriately such that the depletion layer formed when the reverse bias is applied is extended to such a degree that the end face $F_{V1}$ of depletion layer $V_1$ extending from one junction surface $J_1$ among the junction surfaces between the n⁻ semiconductor layer 11 and the p⁺ semiconductor layer 12 partitioned by the n⁻ semiconductor layer 11, and the end face $FV_2$ of depletion layer $V_2$ extending from another junction surface $J_2$ among the junction surfaces between the n⁻ semiconductor layer 11 and the p⁺ semiconductor layer 12 come into contact, and these values are not limited to the values presented above as examples.

Figure 9A:
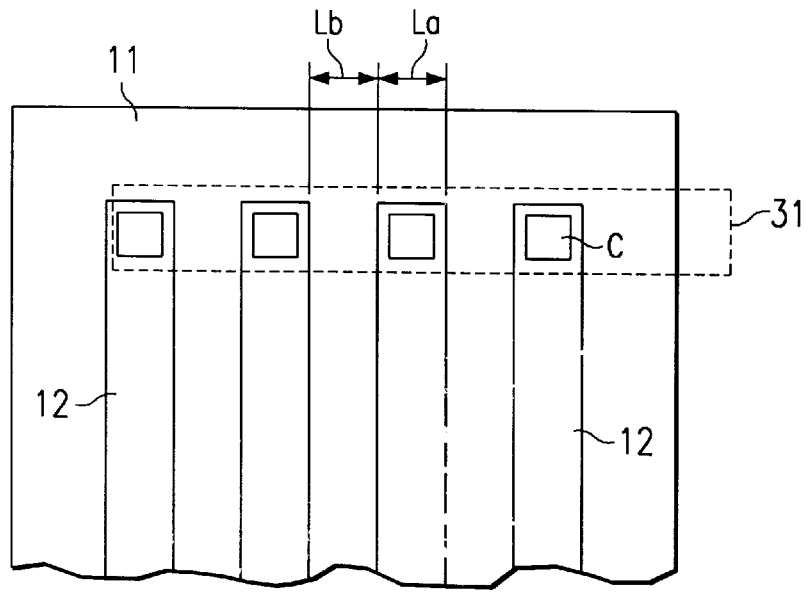
FIGS. 9(a) and (b) show a plan view of an example of the PIN photodiode shown in FIG. 8.
Figure 9B:
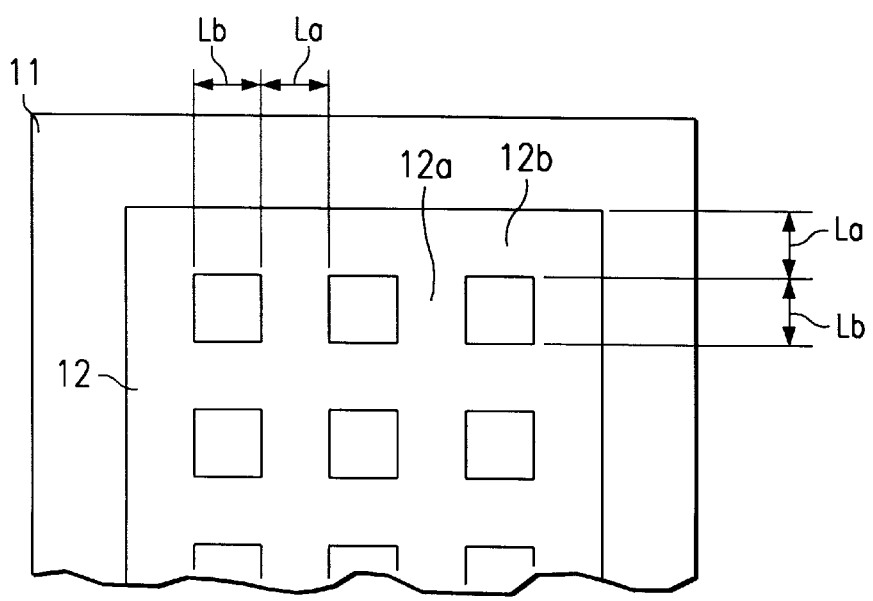

FIG. 9(a) and FIG. 9(b) show a plan view of an example of a PIN photodiode having the aforementioned cross section, where FIG. 8(a) is equivalent to the cross section along A–A' in the figures.

If p⁺ semiconductor layer 12 is partitioned and its surface resistance is raised too high, then the opportunities for electron-hole pair recombination are increased, thereby canceling the increase in sensitivity. due to light reaching the depletion layer directly without passing through non-depleted regions, so it is preferable for the partitioning to be performed to such a degree that the surface resistance is not raised, as the layout of the p⁺ semiconductor layer 12 may be given a banded pattern or checkerboard pattern.

The PIN photodiode shown in FIG. 9(a) has the p⁺ semiconductor layer 12 formed in a banded pattern of 4 bands with a width of La in the surface layer region of the n⁻ semiconductor layer 11 in the drawing, in a layout such that they are partitioned from the adjacent band of p⁺ semiconductor layer 12 by bands of the n⁻ semiconductor layer 11 with a width of Lb. The four bands of the p⁺ semiconductor layer 12 are electrically connected at their contacts C by means of common upper-layer wiring 31 through which a voltage is applied.

The PIN photodiode shown in FIG. 9(b) has in the surface layer region of the n7 semiconductor layer 11, a first p⁺ semiconductor layer 12a formed in a banded pattern of 4 bands extending in a first direction in the drawing, and a second p⁺ semiconductor layer 12b formed in a banded pattern of several bands extending in a direction perpendicular to the first direction, such that the first p⁺ semiconductor layer 12a and second p⁺ semiconductor layer 12b constitute the p⁺ semiconductor layer 12 in a checkerboard pattern.

The first p⁺ semiconductor layer 12a and second p⁺ semiconductor layer 12b are each formed with a width of La, and they are each partitioned from the adjacent first p⁺ semiconductor layer 12a and second p⁺ semiconductor layer 12b by the width Lb.

The semiconductor device according to the aforementioned embodiment can be manufactured in the same manner as Embodiment 2 except that the resist mask used at the time of ion implantation of conductive impurities in the surface layer region of the n⁻ layer 11 has the aforementioned banded or checkerboard hole pattern, so in the method of manufacturing diodes, it is possible to remove the insulating film which is the layer atop the diode without the occurrence of film peeling or leakage.

Embodiment 4

Figure 10:
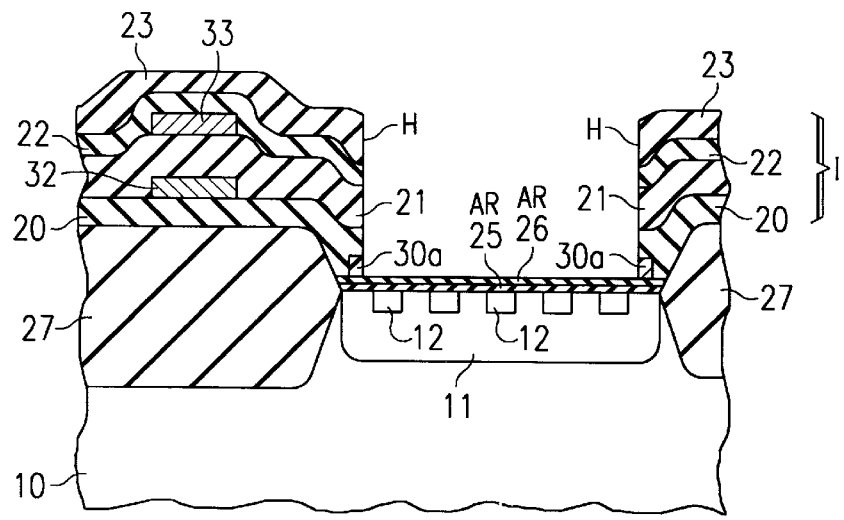
FIG. 10 is a cross-sectional diagram of a semiconductor device having a PIN photodiode according to Embodiment 4.

FIG. 10 is a cross-sectional diagram of a semiconductor device having a PIN photodiode according to this embodiment.

It is essentially identical to that of the semiconductor device according to Embodiment 2 shown in FIG. 8(a), but differing in that the PIN photodiode is formed in an active region partitioned by a LOCOS element separation insulating film 27, and in the LOCOS element separation insulating film 27 region (field region), aluminum or other wiring (32, 33) is formed between the first insulating film 20 and second insulating film 21 and between the second insulating film 21 and third insulating film 22, and the insulating film I consists of the aforementioned four layers of insulating films.

Here follows a description of the method of manufacturing the aforementioned PIN photodiode.

Figure 11A:
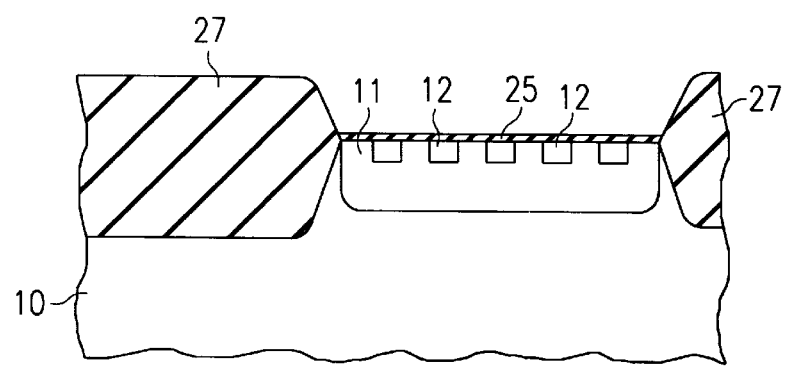
FIG. 11 is a cross-sectional diagram illustrating the manufacturing process in the method of manufacturing the semiconductor devices shown in FIG. 10, where (a) shows the process up until the formation of the silicon oxide film and (b) shows the process up until the formation of the mask layer.

First, as shown in FIG. 11(a), a silicon semiconductor substrate 10 is subjected to ion implantation with phosphorus or other n-type impurities to a concentration of roughly $10^{13}$–$10^{15}$/cm³, for example, to form an n⁻ semiconductor layer (n⁻ well) 11.

Next, in the PIN diode formation region (for example, a 100 μm×100 μm region), ion implantation with boron or other p-type impurities is performed to a concentration of roughly $10^{18}$–$10^{20}$/cm³ using a resist mask (not shown) to form a p⁺ semiconductor layer 12 upon the surface layer region (a region to a depth of roughly 0.5–0.8 μm from the surface of the n⁻ semiconductor layer 11) of the n⁻ semiconductor layer 11.

Here, the p⁺ semiconductor layer 12 is formed by ion implantation using a resist film with holes in a banded or checkerboard hole pattern as the mask, so it can be formed into a banded or checkerboard hole pattern as shown in FIG. 9(a) or FIG. 9(b).

Next, a silicon oxide film 25 with a thickness of roughly 30 nm, for example, is formed by means of the low-pressure CVD method using TEOS as the raw material, for example, upon the active region active region partitioned by the LOCOS element separation insulating film 27.

Figure 11B:
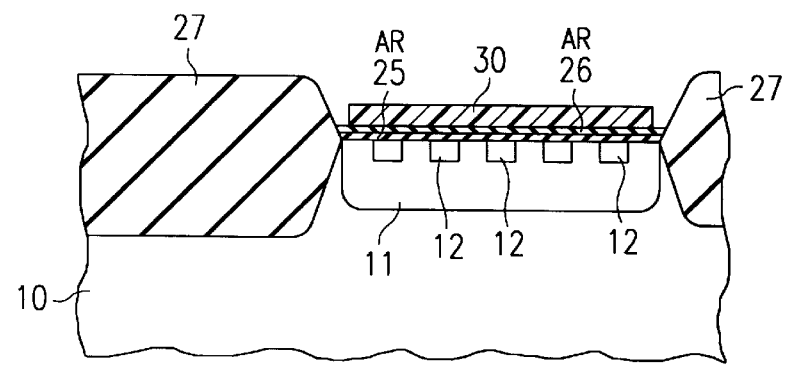

Next, as shown in FIG. 11(b), a silicon nitride film 26 with a thickness of roughly 37 nm, for example, is formed by means of the low-pressure CVD method, for example, and patterning is performed if necessary.

This completes the formation of the anti-reflection film AR consisting of the silicon oxide film 25 and the silicon nitride film 26.

Next, a layer of TiW or other metal is deposited upon the top layer of the anti-reflection film AR to a film thickness of 200–300 nm by the sputtering method, for example, and patterning is performed to form a mask layer 30 on the top layer of the anti-reflection film AR.

Here, the material constituting the mask layer 30 may be any removable material that has selectivity with respect to the lower-layer anti-reflection film AR (having a silicon nitride film on its surface in this embodiment) and the insulating film (silicon oxide, silicon nitride, etc.) to be formed in a subsequent step, and is not limited to the aforementioned metal layer.

Figure 12A:
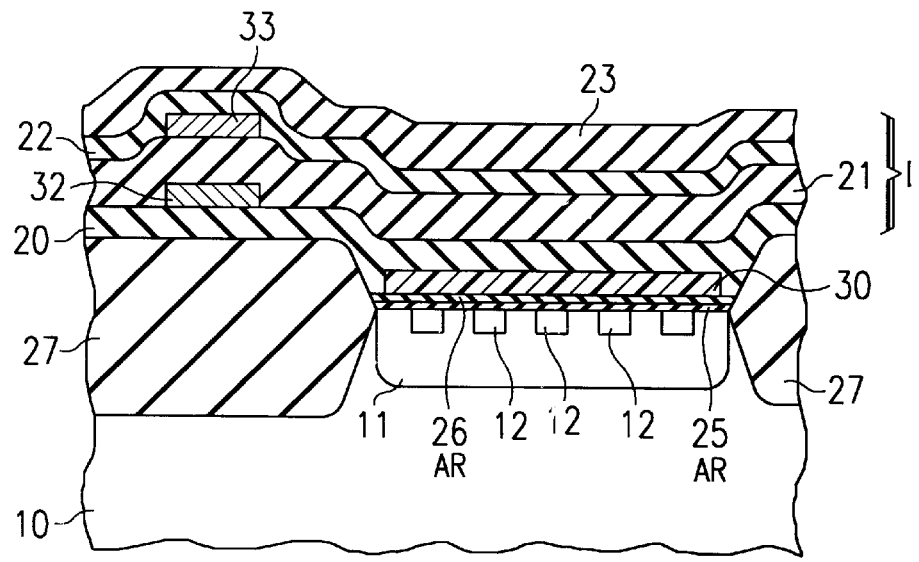
FIG. 12 is a cross-sectional diagram illustrating a continuation of the process shown in FIG. 11, where (a) shows the process up until the formation of the insulating film and (b) shows the process up until the formation of the hole.

Next, as shown in FIG. 12(a), silicon oxide is deposited upon the entire surface of the top layer of the mask layer 30 to form a first insulating film 20, and then a pattern of aluminum or other wiring 32, for example, is formed on its top layer in the formation region of the LOCOS element separation insulating film 27.

Next, the wiring 32 is covered as silicon oxide is deposited upon the entire surface to form a second insulating film 21, and moreover a pattern of aluminum or other wiring 33, for example, is formed on its top layer in the formation region of the LOCOS element separation insulating film 27.

Next, the wiring 33 is covered as silicon oxide is deposited upon the entire surface to form a third insulating film 22, and moreover a different film formation method is used to laminate a fourth insulating film 23, thus forming the insulating film I consisting of four laminated layers.

Here, the first through fourth insulating films (20–23) may be, for example, silicon oxide films formed by means of the CVD method using TEOS as the raw material, BPSG films, or they may be silicon nitride films or the like.

Here, the material constituting the aforementioned first through fourth insulating films (20–23) may be any removable material that has selectivity with respect to the lower-layer mask layer 30, and is not limited to the aforementioned silicon oxide film or silicon nitride film.

The aforementioned first through fourth insulating films (20–23) are formed in order to reduce the differences in level arising due to the aforementioned wiring (32, 33) and the like.

Figure 12B:
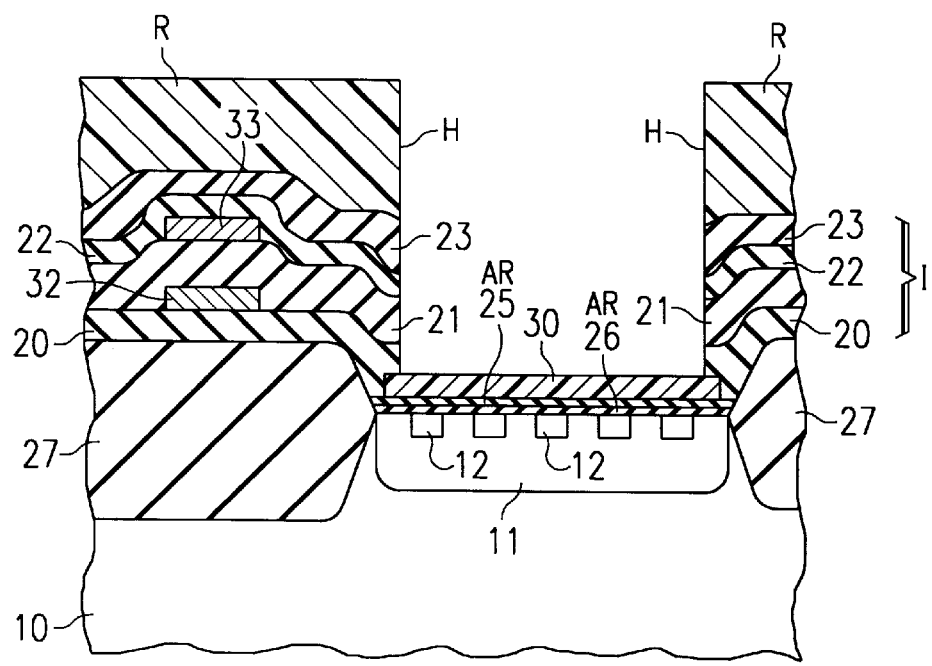
Figure 13A:
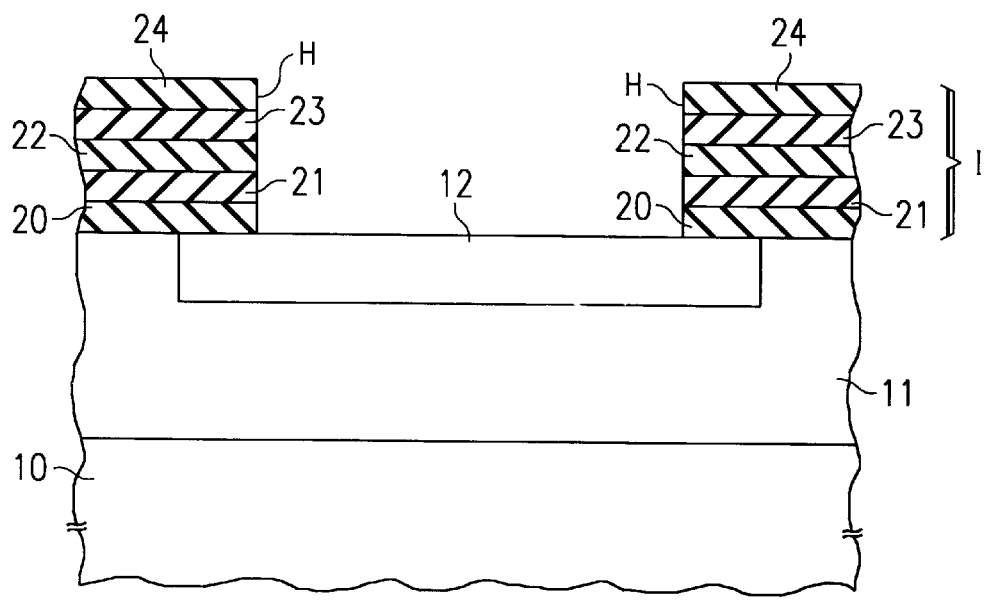
FIG. 13(a) is a cross-sectional diagram of a semiconductor device having a PIN photodiode according to an example of prior art.
Figure 13B:
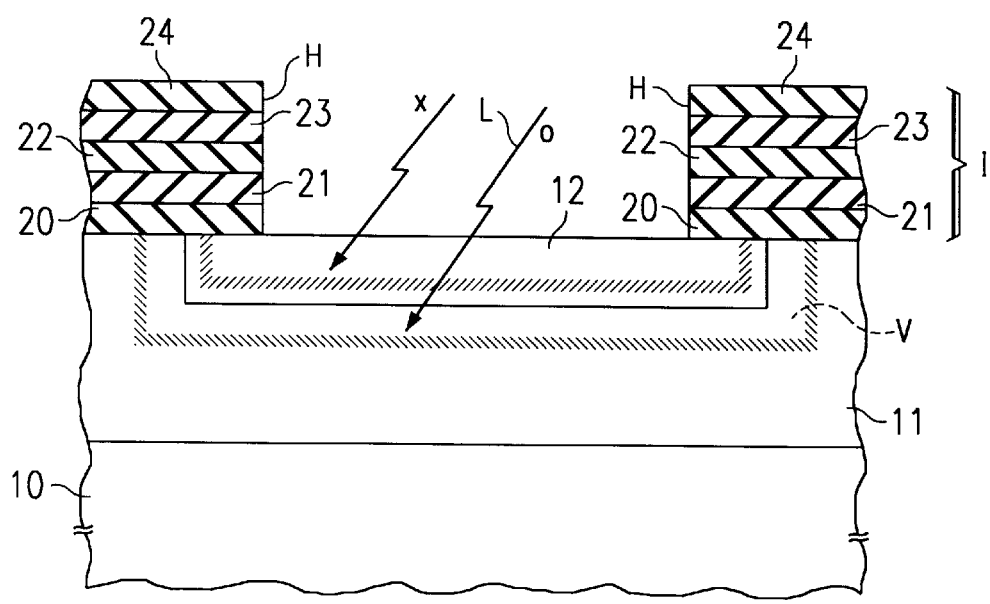
FIG. 13(b) is a diagram showing the widening of the depletion layer when a reverse bias is applied to the PIN photodiode shown in FIG. 13(a).
Figure 14A:
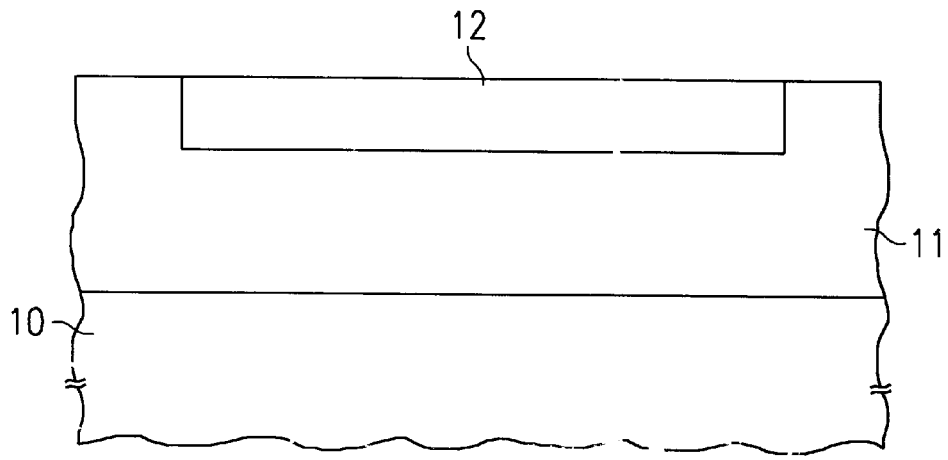
FIG. 14 is a cross-sectional diagram illustrating the manufacturing process in the method of manufacturing the semiconductor devices shown in FIG. 13, where (a) shows the process up until the formation of the p$^+$ semiconductor layer and (b) shows the process up until the formation of the insulating film.
Figure 14B:
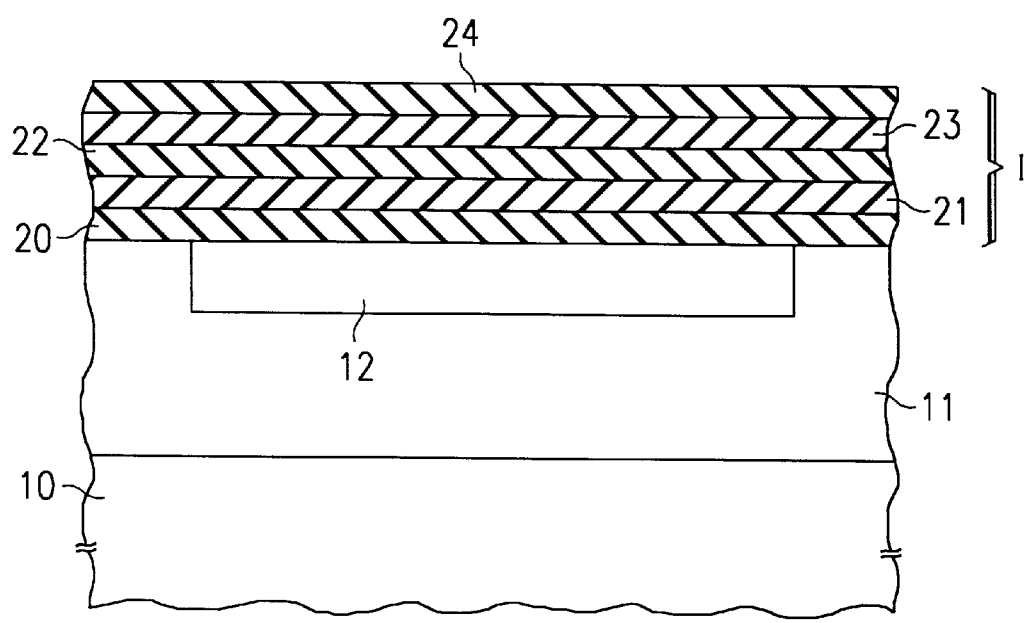
Figure 15:
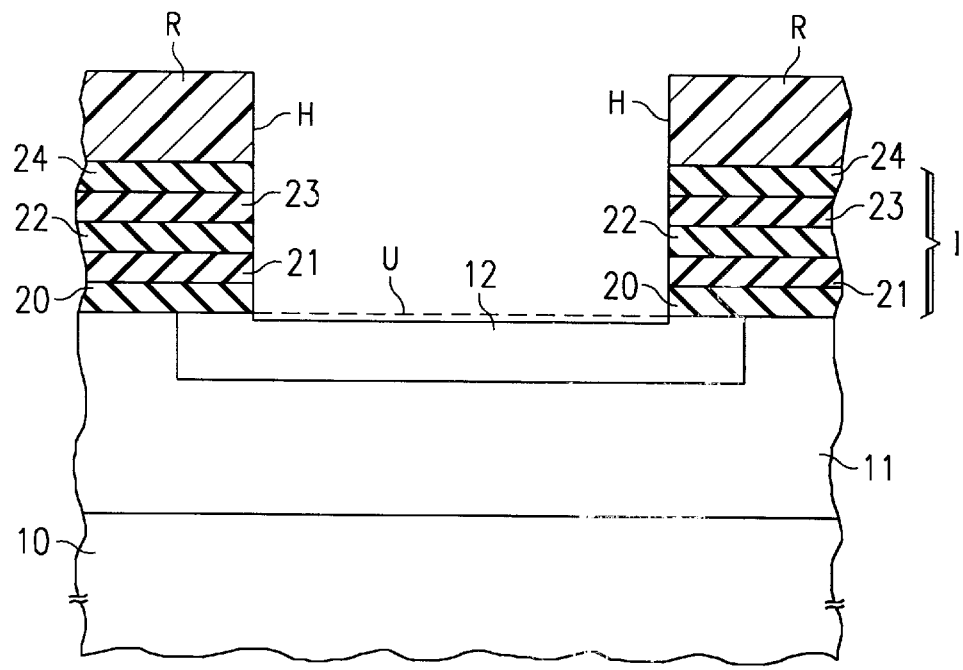
FIG. 15 is a cross-sectional diagram illustrating the problems in the method of manufacturing the semiconductor devices according to the example of prior art.
Figure 16:
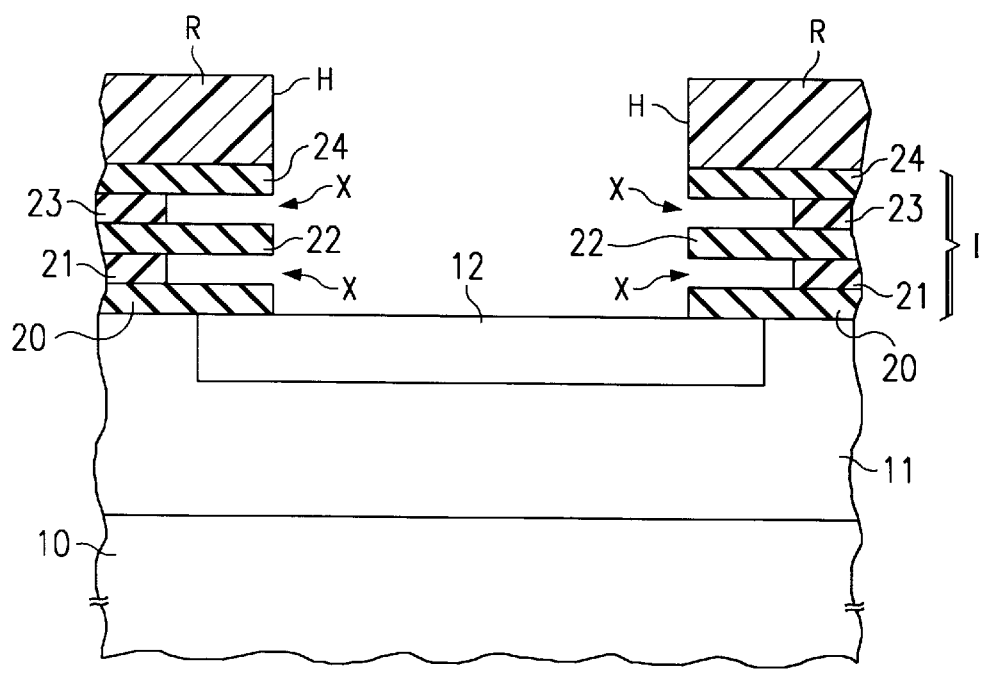
FIG. 16 is a cross-sectional diagram illustrating the problems in the method of manufacturing the semiconductor devices according to the example of prior art.

Next, as shown in FIG. 12(b), a resist film R is formed with a pattern for creating a hole H for the depletion layer region which extends from the interface between the p$^+$ semiconductor layer 12 and n$^-$ semiconductor layer 11 which is the light-sensitive region, and then etching is performed by means of RIE or another type of dry etching to remove the insulating film I on the top layer of the aforementioned light-sensitive region using the mask layer 30 as the etching stopper.

Next, wet etching or the like is used to remove the portions of the mask layer 30 exposed within the hole H selectively with respect to the anti-reflection film AR (having a silicon nitride film on its surface in this embodiment) and insulating film I, thus exposing the anti-reflection film AR. In this manner, the semiconductor device having a PIN photodiode according to this embodiment shown in FIG. 10 can be manufactured.

By means of the aforementioned method of manufacturing photodiodes according to the present embodiment, when the insulating film I which is the layer atop the diode is removed, the mask layer 30 is used as the etching stopper, so in order to prevent the occurrence of gouging from the wall surface in the interior of the hole H which causes film peeling, even when dry etching or other etching techniques are used, the substrate at this stage (the p$^+$ semiconductor layer 12) is protected by the mask layer 30 and anti-reflection film AR, so it does not suffer damage which causes leakage.

In addition, when the aforementioned mask layer 30 exposed in the interior of the hole H is removed, in order to prevent damage to the substrate (the p$^+$ semiconductor layer 12), even if wet etching or other etching techniques are used, it is possible to selectively remove the mask layer 30 without the occurrence of gouging from the wall surface in the interior of the hole H in the first insulating film I.

Therefore, in the method of manufacturing diodes, it is possible to remove the insulating film which is the layer atop the diode without the occurrence of film peeling or leakage.

A PIN photodiode according to the aforementioned embodiment may be sensitive to light with wavelengths of 780 nm and 650 nm, for example, so it is widely usable as the light receiving device for optical pickup devices built into CD, DVD or other optical disk drives.

The present invention is in no way limited to the aforementioned embodiments.

For example, it is applicable not only to PIN photodiodes but also to photodiodes in general.

In addition, in Embodiments 1, 2 and 3, the n$^-$ semiconductor layer may also be formed by epitaxial growth.

In addition, the aforementioned embodiments are applicable to PIN photodiodes or other photodiodes in which the ptype impurities and n-type impurities are interchanged.

In addition, for example, the junction depth of the second conduction type (e.g., p$^+$ type) semiconductor region with respect to the first conduction type (e.g., nr type) semiconductor region, the detailed layout such as the width of the banded pattern or checkerboard pattern, the impurity concentration in semiconductor regions of various conduction types, the voltage applied to the impurity concentration in semiconductor regions of various conduction types may be changed appropriately.

These and other modifications are possible as long as they do not substantially depart from the gist of the invention.

By means of the aforementioned method of manufacturing photodiodes according to the present embodiment, when the insulating film which is the layer atop the diode is removed, the mask layer is used as the etching stopper, so in order to prevent the occurrence of gouging from the wall surface in the interior of the hole which causes film peeling, even when dry etching or other etching techniques are used, the-substrate at this stage (the p$^+$ semiconductor layer) is protected by the mask layer and the anti-reflection film, so it does not suffer damage which causes leakage.

In addition, when the aforementioned mask layer exposed in the interior of the hole is removed, in order to prevent damage to the substrate (the p$^+$ semiconductor layer), even if wet etching or other etching techniques are used, it is possible to selectively remove the mask layer without the occurrence of gouging from the wall surface in the interior of the hole in the first insulating film.

Therefore, in the method of manufacturing diodes, it is possible to remove the insulating film which is the layer atop the diode without the occurrence of film peeling or leakage.

In addition, the second semiconductor layer is formed such that it has portions partitioned by means of the first semiconductor layer on at least a single cross section, so when stipulated voltages are applied to the first semiconductor layer and second semiconductor layer, respectively, the depletion layer extends from each junction surface toward the first semiconductor layer between said second semiconductor layers, and the portions of the semiconductor layer in the portions that partition the second semiconductor layer can be made a depletion layer contributing to photoelectric conversion, thus increasing the sensitivity of the photodiode and improving its characteristics.

What is claimed is:

1. A method of manufacturing photodiodes comprising:

forming a second semiconductor layer of a second conduction type upon the primary surface of a first semiconductor layer of a first conduction type, forming a mask layer upon said second semiconductor layer, forming a first insulating layer on said mask layer;

a first etching step of etching said first insulating layer by using said mask layer as a stopper, thus forming a hole above said mask layer, and a second etching step of removing said mask layer by etching via said hole, wherein a portion of the mask layer at edges of the hole remain to protect the primary surface of the first semiconductor layer from etching damage.

2. The method of manufacturing photodiodes according to claim 1, further comprising forming a second insulating layer upon said second semiconductor layer, thus forming said mask layer upon said second insulating layer.

3. The method of manufacturing photodiodes according to claim 1, wherein said first insulating layer comprises a silicon oxide film or silicon nitride film, and said mask layer is a metal film.

4. A method of manufacturing photodiodes comprising:

forming a second semiconductor layer of a second conduction type upon a primary surface of a first semiconductor layer of a first conduction type, forming a mask layer upon said second semiconductor layer, forming a first insulating layer on said mask layer;

a first etching step of etching said first insulating layer by using said mask layer as a stopper, thus forming a hole above said mask layer, and a second etching step of removing said mask layer by etching via said hole, wherein said first etching is dry etching and said second etching is wet etching.

5. The method of manufacturing photodiodes according to claim 1, wherein said second semiconductor layer is formed in a banded pattern comprising mutually separated first semiconductor regions and second semiconductor regions.

6. The method of manufacturing photodiodes according to claim 1, wherein said second semiconductor layer is formed in a checkerboard pattern.

7. The method of manufacturing photodiodes according to claim 2, wherein said first insulating layer comprises a silicon oxide film or silicon nitride film, and said mask layer is a metal film.

8. The method of manufacturing photodiodes according to claim 2, wherein said first etching is dry etching and said second etching is wet etching.

9. The method of manufacturing photodiodes according to claim 3, wherein said first etching is dry etching and said second etching is wet etching.

10. The method of manufacturing photodiodes according to claim 2, wherein said second semiconductor layer is formed in a banded pattern comprising mutually separated first semiconductor regions and second semiconductor regions.

11. The method of manufacturing photodiodes according to claim 3, wherein said second semiconductor layer is formed in a banded pattern comprising mutually separated first semiconductor regions and second semiconductor regions.

12. The method of manufacturing photodiodes according to claim 4, wherein said second semiconductor layer is formed in a banded pattern comprising mutually separated first semiconductor regions and second semiconductor regions.

13. The method of manufacturing photodiodes according to claim 2, wherein said second semiconductor layer is formed in a checkerboard pattern.

14. The method of manufacturing photodiodes according to claim 3, wherein said second semiconductor layer is formed in a checkerboard pattern.

15. The method of manufacturing photodiodes according to claim 4, wherein said second semiconductor layer is formed in a checkerboard pattern.

* * * * *